United States Patent
Sugawara et al.

(10) Patent No.: US 8,409,961 B2
(45) Date of Patent: Apr. 2, 2013

(54) ALTERATION METHOD AND ALTERATION APPARATUS FOR TITANIUM NITRIDE

(75) Inventors: Takuya Sugawara, Yamanashi (JP); Yoshihiro Sato, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/055,154

(22) PCT Filed: Jul. 8, 2009

(86) PCT No.: PCT/JP2009/062461
§ 371 (c)(1),
(2), (4) Date: Jan. 21, 2011

(87) PCT Pub. No.: WO2010/010816
PCT Pub. Date: Jan. 28, 2010

(65) Prior Publication Data
US 2011/0124175 A1    May 26, 2011

(30) Foreign Application Priority Data
Jul. 22, 2008   (JP) .................. 2008-189079

(51) Int. Cl.
*H01L 21/20* (2006.01)
(52) U.S. Cl. . 438/385; 438/513; 438/795; 257/E21.001; 257/E21.002; 257/E21.006
(58) Field of Classification Search ........... 438/385, 438/382, 513, 775, 776, 777, 795; 257/E21.001, 257/E21.002, E21.006; 427/255.391, 535
See application file for complete search history.

(56) References Cited

U.S. PATENT DOCUMENTS

| | | | |
|---|---|---|---|
| 6,555,183 B2 * | 4/2003 | Wang et al. | 427/535 |
| 2003/0091739 A1 | 5/2003 | Sakamoto et al. | |
| 2006/0199398 A1 | 9/2006 | Sugawara et al. | |
| 2007/0120107 A1 | 5/2007 | Hayakawa | |
| 2008/0054246 A1 * | 3/2008 | Sato | 257/4 |
| 2008/0067490 A1 * | 3/2008 | Hayakawa | 257/4 |
| 2008/0210923 A1 * | 9/2008 | Sato | 257/4 |

FOREIGN PATENT DOCUMENTS

| | | |
|---|---|---|
| JP | 08-246152 | 9/1996 |
| JP | 2001-508497 | 6/2001 |
| JP | 2003-229379 | 8/2003 |
| JP | 2004-356528 | 12/2004 |
| JP | 2005-536052 | 11/2005 |
| JP | 2006-313778 | 11/2006 |
| JP | 2007-149899 | 6/2007 |
| JP | 2008-016741 | 1/2008 |
| JP | 2008-053494 | 3/2008 |
| JP | 2008-066449 | 3/2008 |
| WO | WO 2004/017437 | 2/2004 |

OTHER PUBLICATIONS

Japanese Office Action dated Jul. 27, 2010.

* cited by examiner

*Primary Examiner* — Hsien Ming Lee
(74) *Attorney, Agent, or Firm* — IPUSA, PLLC

(57) ABSTRACT

An alteration method of a titanium nitride film, comprising exposing a titanium nitride film formed on a semiconductor substrate to plasma obtained by exciting a process gas that includes noble gas or nitrogen and excludes oxygen, thereby increasing a specific resistance of the titanium nitride film.

6 Claims, 13 Drawing Sheets

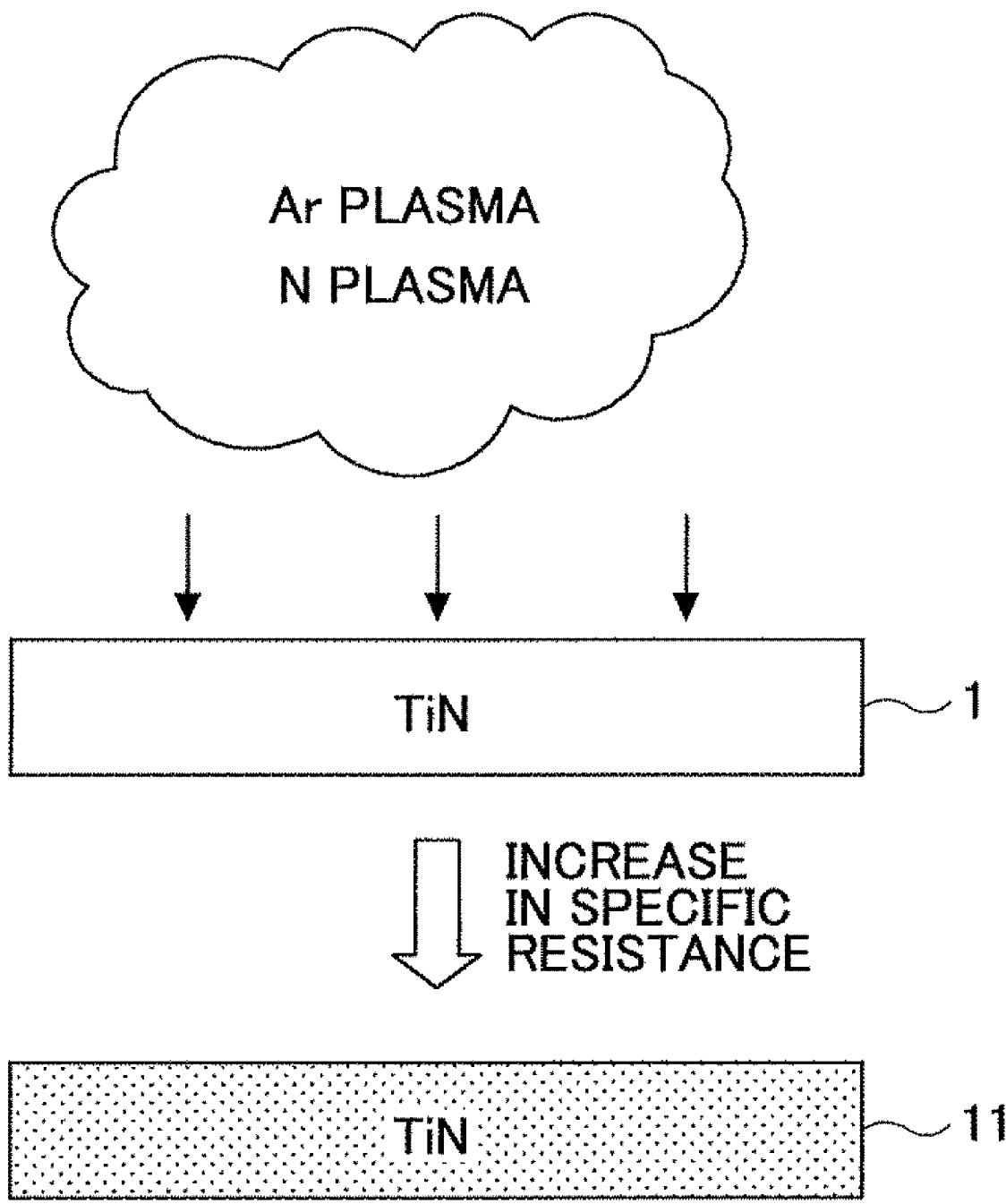

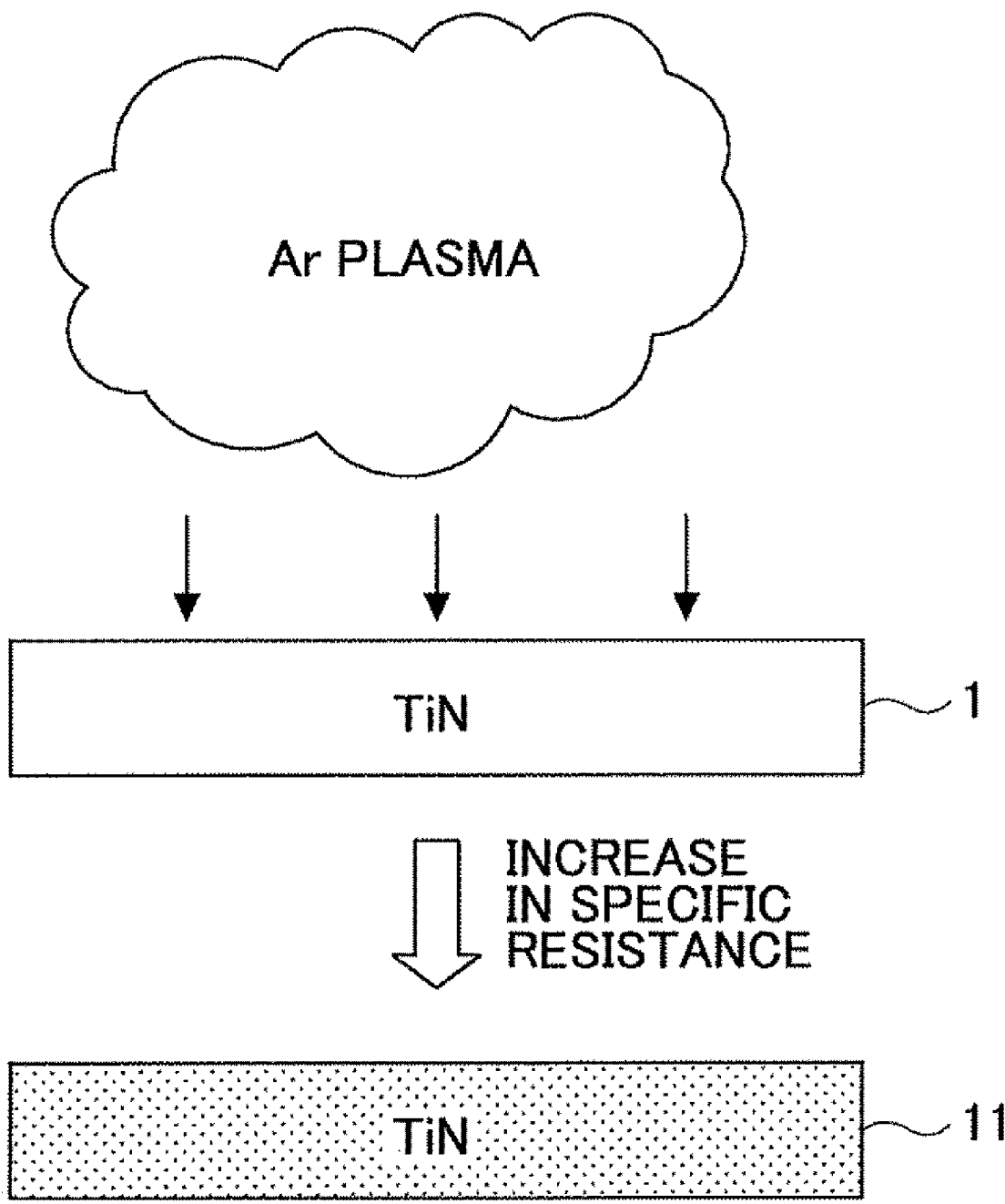

US 8,409,961 B2

ALTERATION METHOD AND ALTERATION APPARATUS FOR TITANIUM NITRIDE

TECHNICAL FIELD

The present invention relates to a technology that increases specific resistance of a titanium nitride film.

BACKGROUND ART

As a next generation semiconductor memory, a Phase-change Random Access Memory (PRAM) as a non-volatile memory using a phase-change technology has been developed. The PRAM uses a phase-change film as a memory element, where information is stored by changing a part of the film into a crystal state or an amorphous state. As the phase-change film, for example, a GST (germanium antimony tellurium: $Ge_xSb_yTe_z$) film is used. When heat corresponding to 600° C., which is the melting temperature of GST, or more is applied to GST in a short period of time (Treset<30 ns), and then the GST is rapidly cooled, the GST is in the amorphous state. When heat corresponding to a temperature less than the melting temperature is applied to the GTS in the amorphous state for a long time (Tset>about 50 ns), the GST is changed into the crystal state. As shown in FIG. 12, electric current is rarely changed with an applied voltage up to about 0.7 V, which is indicative of a large resistance, in the amorphous state, while electric current is increased in proportion to an applied voltage, which is indicative of a low resistance, in the crystal state.

Therefore, a heater film that controls a temperature of the GST film is provided to contact with the GST film. By adjusting current to be applied to the heater film and a period of time during which the current is applied, thereby adjusting Joule heat generated from the heater film, namely, by adjusting the temperature and the time period during which the GST film is heated, the GST film can be in the crystal state or the amorphous state. Specifically, after a current (melting current) sufficient to fully heat the GST film up to the melting temperature is applied to the heater film, the current is turned off, a memory cell is reset, while when a current (crystallization current) is applied to the heater film, and thus data are written into the memory cell. In addition, by applying to the GST film a current that exists in a current range corresponding to a high resistance in the amorphous state (high resistance) and a low resistance in the crystal state (low resistance), the data in the GST film can be read out. Here, when the current flows through the heater film, because the Joule heat is in proportion to the resistance of the heater film, the temperature of the GST film having higher resistance becomes higher at the same temperature.

As the heater film, a titanium nitride (TiN) film is considered as promising from a viewpoint of a cost and a thermal stability. However, because the TiN film used in the current semiconductor market has a low specific resistance of 130 μΩ·cm, when the TiN film is used to sufficiently heat the GST film, energy consumption is increased. When there is an attempt to reduce the energy consumption, the GST film cannot be sufficiently heated. In addition, since the TiN film has a greater specific resistance when oxidized, the GST film may be degraded when oxygen is diffused from a boundary between the TiN film and the oxide film because the GST film is not stable against oxygen. Moreover, when the TiN film is oxidized, a TiOx film, which is a robust insulating film, is formed. With this, a characteristic of the TiN film serving as metal is degraded. Therefore, use of the oxidized TiN film as the heater for heating the GST film is not advisable.

In addition, when the TiN film is thinned, the electric resistance of the TiN film becomes larger. However, it is difficult to deposit a thin film having greater film thickness uniformity across the surface thereof. Therefore, it has been desired to establish a method of generating greater Joule heat by increasing the specific resistance while the thickness of the TiN film is maintained at a certain thickness, for example, about 50 nm.

Incidentally, Patent Documents 1 and 2 describe a method of changing the specific resistance of the TiN film. Patent Document 1 discloses an invention that reduces impurities such as chlorine by exposing the TiN film to ammonia plasma, and Patent Document 2 discloses an invention that densifies the TiN film by exposing the TiN film to inert gas plasma, which reduce the specific resistance. When the TIN films are used as a diffusion preventive film against a plug filled in a via, the TiN films, which serve as a wiring structure, preferably have a low specific resistance. The invention disclosed in Patent Document 2 has been made from such a point of view.

Patent Documents 1 and 2 provide no idea of using the TiN film serving as the heater film for the phase-change film and no expectation of increasing the specific resistance. Therefore, even if the technologies disclosed in the documents are utilized, the specific resistance of the TiN film cannot be increased.

Patent Document 1: Japanese Translation of PCT International Patent Application No. 2001-508497.

Patent Document 2: Japanese Patent Application Laid-Open Publication No. H08-246152.

SUMMARY OF INVENTION

Problems to be Solved by the Invention

The present invention has been made in view of the above, and provides a technology that enables increasing a specific resistance of a titanium nitride film.

Means of Solving the Problems

An embodiment of the present invention provides an alteration method of a titanium nitride film, comprising exposing a titanium nitride film formed on a semiconductor substrate to plasma obtained by exciting a process gas that includes noble gas or nitrogen and excludes oxygen, thereby increasing a specific resistance of the titanium nitride film.

Another embodiment of the present invention provides an alteration apparatus of a titanium nitride film, configured to expose a titanium nitride film formed on a semiconductor substrate to plasma obtained by exciting a process gas that includes noble gas or nitrogen and excludes oxygen, thereby increasing a specific resistance of the titanium nitride film.

Yet another embodiment of the preset invention provides an alteration apparatus of the titanium nitride film, the apparatus comprising an air-tight process chamber that has a susceptor on which a semiconductor substrate having the titanium nitride film in the process chamber; a process gas supplying part that supplies the process gas to the process chamber; a plasma generating part that activates the process gas to plasma; and an evacuating part that evacuates the process chamber.

BRIEF DESCRIPTION OF THE DRAWINGS

FIG. 1A is an explanatory view illustrating an outline of an alteration method of a TiN film, according to an embodiment of the present invention.

FIG. 1B is another explanatory view illustrating an outline of an alteration method of a TiN film, according to an embodiment of the present invention.

MODE(S) FOR CARRYING OUT THE INVENTION

Figure 2:
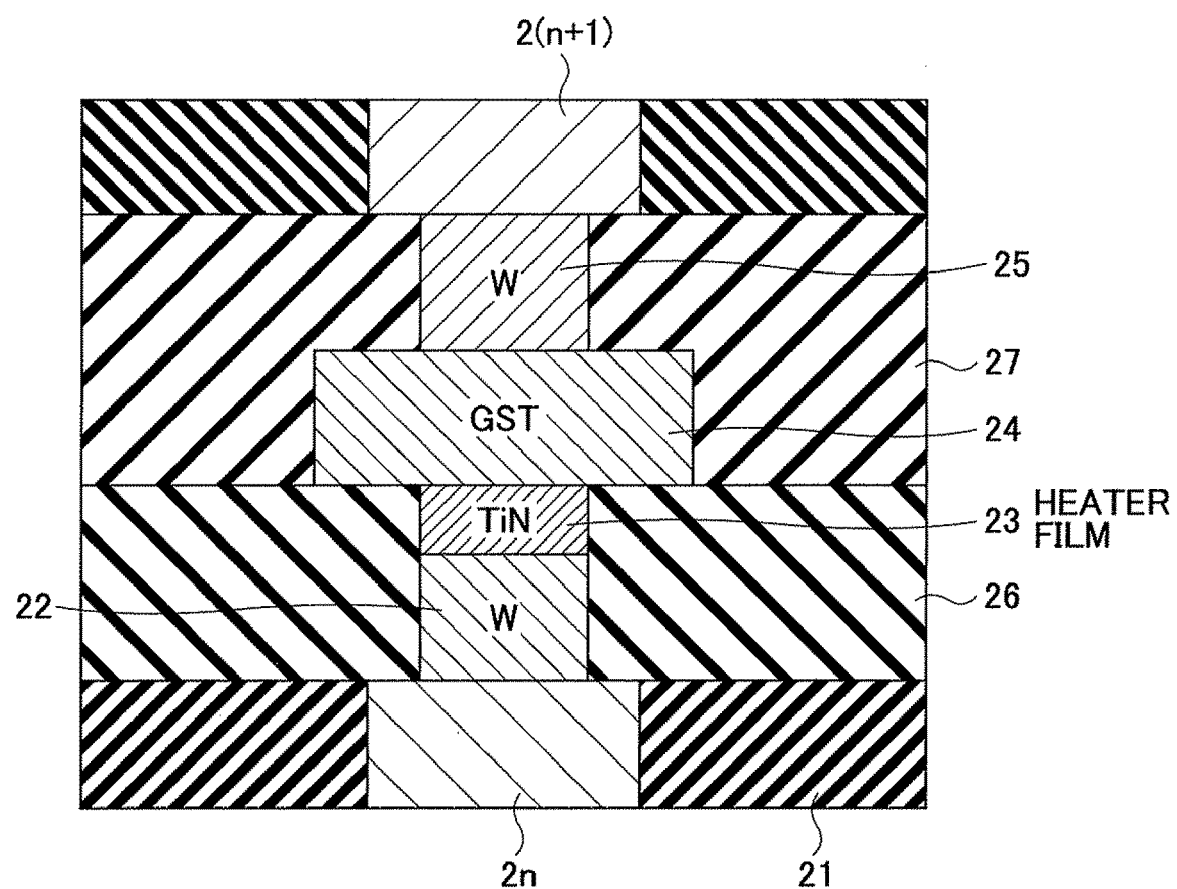
FIG. 2 is a cross-sectional view illustrating an example of a device structure including a TiN film that is altered by the alteration method according to an embodiment of the present invention.

According to embodiments of the present invention, a specific resistance of a titanium nitride film can be increased by exposing the titanium nitride film to plasma generated by exciting a process gas including a noble gas or nitrogen and no oxygen.

First, an alteration method of a titanium nitride film, according to an embodiment of the present invention is outlined. This alteration method is to increase a specific resistance of the titanium nitride (TiN) film formed on a semiconductor substrate, for example, a silicon wafer 10 (referred to as a wafer 10, hereinafter), an embodiment of which is carried out by exciting a process gas that includes a noble gas or a nitrogen gas and does not include oxygen to plasma, and exposing a TIN film 1 to the plasma, as shown in FIG. 1A.

As the noble gas, one of Argon (Ar) gas, Neon (Ne) gas, and Helium (He) gas is preferably used. In addition, as a gas including nitrogen, a nitrogen ($N_2$) gas, an ammonia gas ($NH_3$), or the like is preferably used. A mixed gas of the $N_2$ gas and hydrogen ($H_2$) gas may be used.

While the noble gas is used to facilitate ignition of plasma and stabilize the plasma, the noble gas is not always used when plasma can be generated only with the $N_2$ gas by adjusting process parameters such as configuration of a plasma generation apparatus and the like.

Incidentally, "not to include oxygen" does not mean that inevitable oxygen such as oxygen included as an impurity in the gas to be used or residual oxygen gas when a vacuum line is evacuated to the reachable possible vacuum are not included. For example, a process gas to be supplied to a plasma process apparatus is a gas including no oxygen when an oxygen gas source is not connected to a process gas supplying source in the plasma process apparatus where the alteration method according to the embodiment of the present invention, which is described later, is carried out In addition, a process gas corresponds to the process gas including no oxygen even if an extremely small quantity of oxygen is included when effects of the embodiment of the present invention is provided and the extremely small quantity is meaningless in practicing the embodiment of the present invention.

In the alteration process, process pressures, partial pressures of each gas (compositions), and the like may be arbitrarily chosen depending on a specific resistance to be achieved, because the specific resistance of the TiN film after the alteration process is changed depending on the process pressures of the total process atmosphere of the gas including the noble gas and the nitrogen, as described later.

When the TiN film is exposed to the plasma of the gas including the noble gas and the nitrogen gas under appropriate process pressures, the TiN film is altered and the TiN film 11 having a greater specific resistance is obtained. This may be because nitrogen is incorporated into the TIN film 11 by plasma irradiation, and thus film composition is changed, which is described later.

In addition, the TiN film 1 is exposed to plasma of a noble gas that includes no oxygen in other embodiments of the present invention, as shown in FIG. 1B. As the noble gas, one of Argon (Ar) gas, Neon (Ne) gas, and Helium (He) gas is preferably used. "Not to include oxygen" means the same as above.

When the TiN film is exposed to the plasma of the noble gas, the TiN film is altered and the TiN film 11 having a greater specific resistance is obtained. This may be because a crystalline structure of the TiN film 11 is changed by plasma irradiation, which is described in detail later.

As stated above, the alteration process using the gas including the noble gas and the nitrogen gas, or only the nitrogen gas and the alteration process using the noble gas may provide a different mechanism that contributes to an increase in the specific resistance. The specific resistance is preferably increased by 10% or more after the alteration process is applied. In order to obtain such a TiN film, alteration conditions such as process pressures, partial pressures (compositions), process temperature, plasma generation conditions, or the like may be chosen in each alteration process.

Next, a device to be used as a non-volatile memory, which is provided with the TiN film that is altered by the embodiment of the present invention, is explained with reference to FIG. 2 that illustrates a part of the device. In FIG. 2, a reference symbol "$2n$" (n is an integer of 1 or greater) indicates an n-th wiring layer and a reference symbol "$2(n+1)$" indicates an (n+1)-th wiring layer. These wiring layers $2n$, $2(n+1)$ are formed in an insulation film 21. A reference symbol "22" indicates a bottom electrode contact composed of, for example, tungsten (W); a reference symbol "23" indicates a heater film composed of the TiN film that has gone through the alteration process according to the embodiment of the present invention; a reference symbol "24" indicates a phase-change film composed of, for example, a GST film; a reference symbol "25" indicates a top electrode contact composed of tungsten; and reference symbols "26", "27" are an intermetal dielectric film. The heater film 23 is provided in contact with and between the bottom electrode contact 22 and the phase-change film 24. The phase-change film 24 changes its resistance depending on a heating temperature or a heating time.

In such a device structure, when electric power is supplied to the heater film 23, the heater film 23 generates heat, thereby changing the crystalline structure of the phase-change film 24 between a crystalline state and an amorphous state. With the changes in the crystalline structure, the phase-change film 24 changes its resistance, thereby enabling writing and reading of information, as stated above.

When the TIN film is used as the heater film 23, the specific resistance has preferably a specific resistance of, for example, about 150 $\mu\Omega\cdot cm$. In addition, an increase ratio of the specific resistance of the TIN film after the exposure to the plasma of the above-mentioned gas in relation to that of the TiN film before the exposure to the plasma is preferably less than 200%. When the increase ratio exceeds 200%, a relatively high source voltage needs to be applied to the device. Incidentally, the increase ratio is expressed as the following equation.

Increase ratio=((a specific resistance after the exposure to the plasma)−(a specific resistance before the exposure to the plasma))/a specific resistance before the exposure to the plasma×100 (%)

Figure 3:
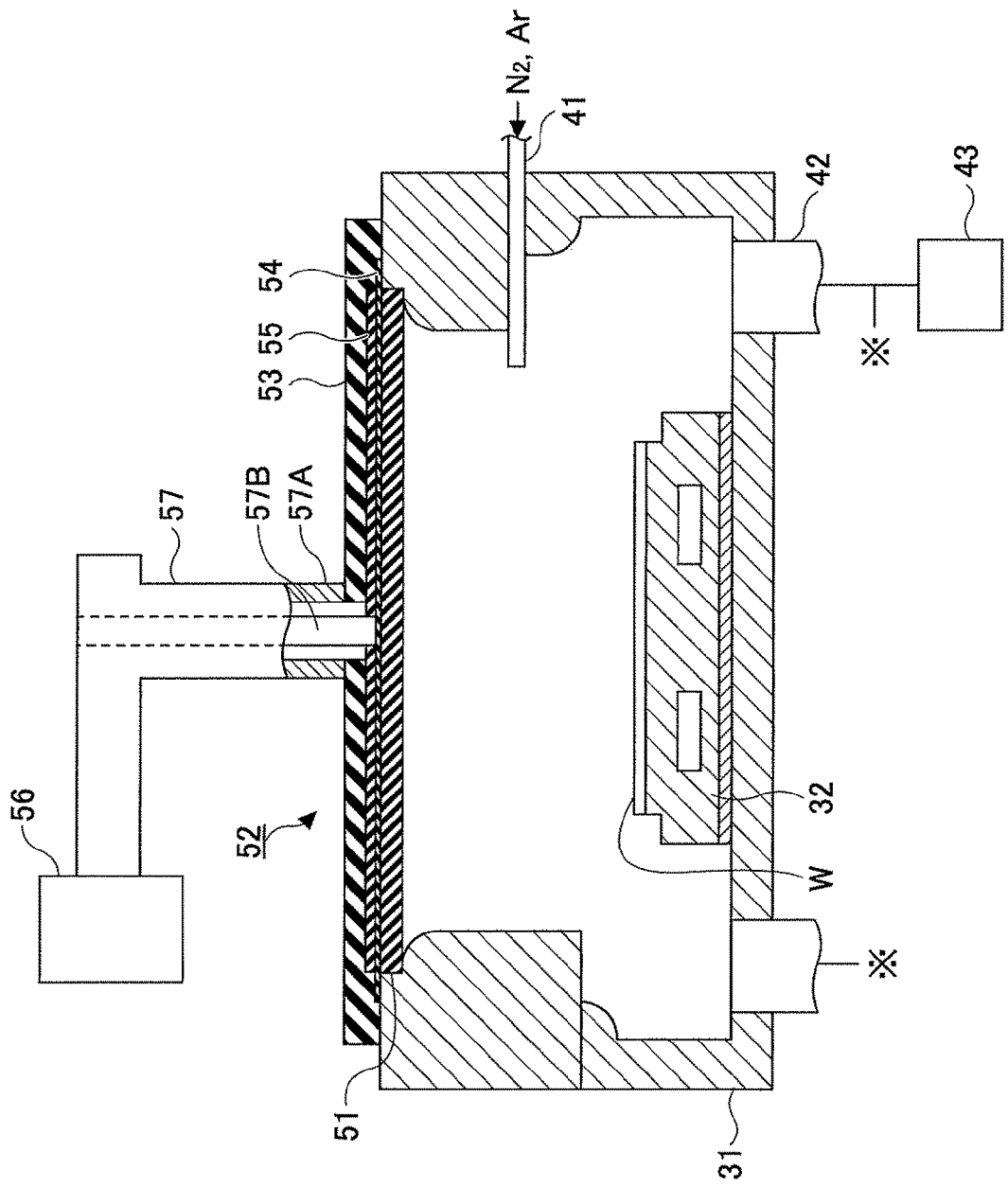
FIG. 3 is a cross-sectional view illustrating an example of a plasma process apparatus where the alteration method according to an embodiment of the present invention may be carried out.
Figure 4:
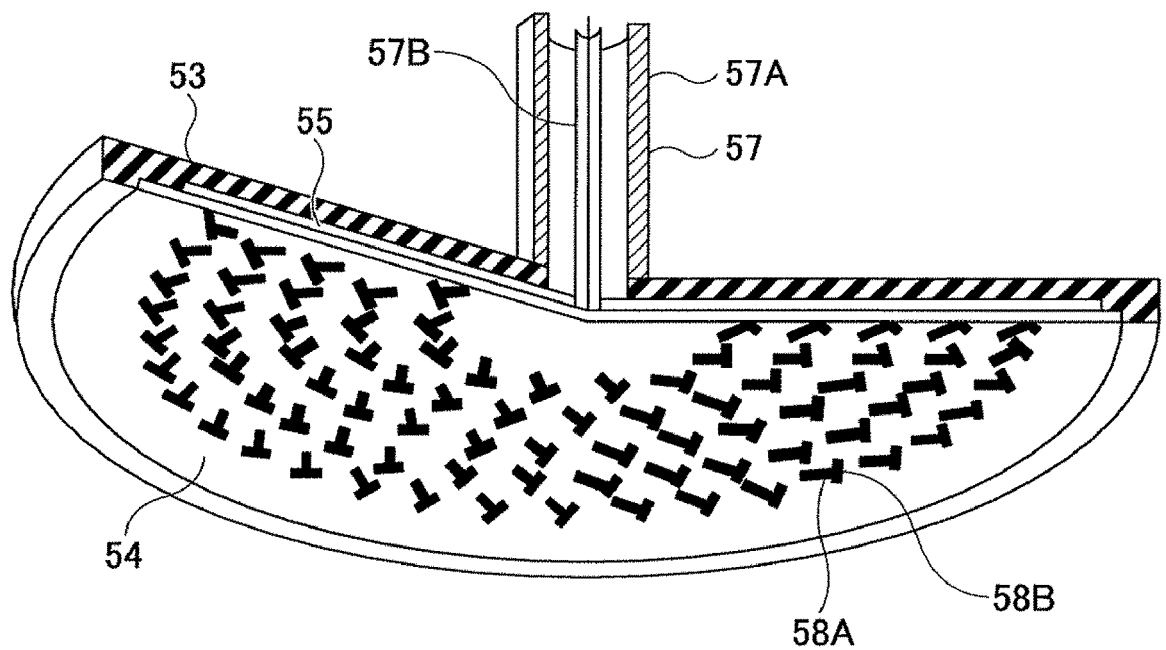
FIG. 4 is a perspective view illustrating a part of the plasma process apparatus.

Next, an alteration apparatus where the alteration method according to the embodiment of the present invention is carried out, with reference to FIGS. 3 and 4. In FIG. 3, a reference symbol "31" indicates a process chamber (vacuum chamber) and a reference symbol "32" indicates a susceptor having a temperature control function. A gas supplying nozzle 41 is provided in a side wall of the process chamber 31. A noble gas supplying source (not shown) of Ar gas, Ne gas, He gas or the like, and a gas supplying source (not shown) of a nitrogen-including gas, for example, $N_2$ gas are connected to the gas supplying nozzle 41, so that a gas including the noble gas and nitrogen is supplied from the gas supplying nozzle 41 to the process chamber 31. The noble gas also serves as a plasma gas. In addition, a reference symbol "42" is an evacuation pipe, which is connected to a vacuum evacuation system 43.

A cover plate 51 composed of a dielectric material, for example, alumina, is provided in an upper end of the process chamber 31. An antenna part 52 is provided on the cover plate 51 so that the antenna part 52 contacts with the cover plate 51. The antenna part 52 is provided with a flat antenna body 53 that has a circular plane shape and whose lower surface side is open, and a planar antenna member (slit plate) 54 that is provided to close the opening of the antenna body 53 and has plural slits. The antenna body 53 and the planar antenna member 54 are composed of an electrically conductive material, and constitute a circular hollow flat waveguide pipe.

In addition, a wavelength shortening plate 55 composed of low loss dielectric material such as alumina, silicon oxide, silicon nitride, or the like is provided between the planar antenna member 54 and the antenna body 53. The wavelength shortening plate 55 shortens a wavelength of microwaves, thereby shortening an in-pipe wavelength in the waveguide pipe. In this embodiment, a radial line slit antenna is composed of the antenna body, the planar antenna member 54, and the wavelength shortening plate 55.

The antenna part 52 so configured is provided in the process chamber 31 via a sealing member (not shown) so that the planar antenna member 54 is closely fit with the cover plate 51. The antenna part 52 is connected to a microwave generation part 56 outside of the apparatus via a coaxial waveguide pipe 57, so that microwaves having a frequency of 2.45 GHz or 8.4 GHz are supplied to the antenna part 52. In this case, an outer waveguide 57 of the coaxial waveguide pipe 57 is connected to the antenna body 53, and a center conductor 57B is connected to the planar antenna member 54 via the opening formed in the wavelength shortening plate 55.

The planar antenna member 54 is made of, for example, a copper plate having a thickness of 1 mm, and has plural slits 58 formed in order to generate circular polarized waves, as shown in FIG. 4. The slits 58, each of which has a pair of slits 58A, 58B arranged slightly away from each other and in substantially a T-shape, are arranged along a concentric circle pattern or a spiral pattern in a circumferential direction. Incidentally, the slits 58A, 58B are arranged slightly away from each other and in substantially an L-shape. Because the slits 58A, 58B are arranged so that where the slits 58A, 58B are substantially orthogonal to each other, the circular polarized waves having two orthogonal polarized wave components are irradiated. In this case, the pairs of the slits 58A, 58B are arranged corresponding to the wavelength of the micro waves whose wavelength is shortened by the wavelength shortening plate 55, so that the micro waves are emitted as a substantial planar wave from the planar antenna member 54. In this example, a plasma generation part is composed of the antenna part 52, the coaxial waveguide pipe 57, and the microwave generation part 56.

Next, an example of the alteration method according to the embodiment of the present invention, which is carried out in the plasma process apparatus is explained, where a gas including the noble gas and nitrogen as a process gas is used. First, a wafer 10 on which a TiN film having a thickness of, for example, about 17 nm is transferred into the process chamber 31 and placed on the susceptor 32.

Next, the inside of the process chamber 31 is evacuated to a predetermined pressure, and the noble gas, for example, the Ar gas is supplied at a partial pressure of, for example, 105 Pa to the process chamber 31, and the nitrogen-including gas, for example, the $N_2$ gas is supplied at a partial pressure of 21.1 Pa to the process chamber 31, from the gas supplying nozzle 41. The inside of the process chamber 31. is maintained at a process pressure of, for example, 126.1 Pa, and a wafer temperature is set at 500° C.

On the other hand, when high frequency waves (microwaves) having a frequency of 2.45 GHz are supplied at an electric power of 1500 W from the microwave generation part 56, the microwaves propagate in a TM mode or a TE mode in the coaxial waveguide pipe 57 (the center conductor 57B) to reach the planar antenna member 54 of the antenna part 52, and radially propagate from the center part to the circumference of the planar antenna member 54. Then, the microwaves are emitted toward a process space below from the pairs of slits 58A, 58B through the cover plate 51.

At this time, the circular polarized waves are emitted from substantially the entire surface of the planar antenna member 54, so that electric field density in the space below the antenna part 52 becomes uniform, because the pairs of slits 58A, 58B are arranged in the above-mentioned manner. With energy of the microwaves, the plasma is uniformly generated at high density with, for example, the Ar gas and the $N_2$ gas in a space between the cover plate 51 and the susceptor 32, and irradiated to the surface of the TiN film on the wafer 10. Such plasma irradiation is carried out, for example, for about 120 seconds.

Next, another example of the alteration method according to the embodiment of the present invention is explained. In this example, only the noble gas is used as the process gas. The noble gas, for example, the Ar gas is supplied at a predetermined partial pressure of, for example, 6.65 Pa from the gas supplying nozzle 41, and the alteration process is carried out at a process pressure of, for example, 6.65 Pa in the process chamber. The other process conditions are the same as the above alteration process where the noble gas and the nitrogen gas are used as the process gas.

As stated above, by irradiating the plasma of the Ar gas and the $N_2$ gas to the TiN film under a process pressure of, for example, 126.1 Pa, or by irradiating the plasma of the Ar gas to the TIN film under a process pressure of, for example, 6.65 Pa, the TiN film is altered so that a sheet resistance is increased.

On the other hand, by irradiating plasma of the Ar gas and the $N_2$ gas to the TiN film under a process pressure of, for example, 20 Pa, the sheet resistance is decreased as explained in an example below. In addition, the sheet resistance is changed depending on a plasma irradiation time. Therefore, the sheet resistance can be increased to a desired level by controlling plasma generation conditions and plasma irradiation time.

Therefore, by setting appropriate process conditions and carrying out the alteration process with respect to the TiN film, the specific resistance of the TiN film can be increased to a level of about 150 μΩ•cm. Therefore, the TiN film so altered is preferable as the heater film for the GST film in the PRAM structure. In addition, when the TiN film so altered to have an increased specific resistance is used as the heater film, costs can be decreased and a thermal stability can be improved.

Moreover, the TiN film so altered to have an increased specific resistance can provide the GST film with a higher temperature at the same current, compared to a conventional TIN film. In the PRAM structure, the phase of the GST film is changed between the crystalline state and the amorphous state by heating the GST film, thereby enabling writing and reading information, utilizing the phase difference, as previously described. In this case, the GST film can be sufficiently heated without providing a large amount of electric energy to the altered TiN film. Therefore, the altered TiN film is used as the heater film for the GST film, and energy consumption required to operate the semiconductor device can be reduced.

EXAMPLES (Alteration Process of TiN Film)

First, p-type silicon (Si) substrates 100 were thermally oxidized to form thermal oxide ($SiO_2$) films having a thickness of 100 nm. Next, TiN films 102 having a thickness of 17 nm were formed on the $SiO_2$ films by a thermal Chemical Vapor Deposition (CVD) method using $TiCl_4$ gas and $NH_3$ gas (see FIG. 5). The TIN film 102 was deposited on each of the $SiO_2$ films by supplying the $TiCl_4$ gas and the $NH_3$ gas as film deposition gases at flow rates of 30 standard cubic centimeter per minute (sccm) and 30 sccm, respectively, under a pressure of 665 Pa (5 Torr), and at a process temperature of 650° C., thereby causing the film deposition gases to react with each other in a gaseous phase.

Subsequently, the TiN films 102 were subjected to the alteration processes under alteration conditions of Example 1, Example 2, and Comparative example 1 in the plasma process apparatus in FIG. 3.

Incidentally, because the Si substrate 100 used has a relatively low specific resistance of 8 to 12 Ω•cm, when the TiN film 102 is formed directly on the Si substrate 100, an electric current flows through the Si substrate 100 in sheet resistance measurement of the TiN film 102 (described later), which makes it difficult to measure resistance of the TiN film 102. Therefore, the $SiO_2$ film as an insulation film is interposed between the Si substrate 100 and the TiN film 102.

The alteration conditions of Example 1 to Comparative example are listed in Table 1.

TABLE 1

| alteration conditions | Ar partial pressure (Pa) | $N_2$ partial pressure (Pa) | $H_2$ partial pressure (Pa) | temperature (° C.) |
|---|---|---|---|---|
| Example 1 | 105.5 | 21.1 | 0.0 | 500 |
| Example 2 | 6.65 | 0.0 | 0.0 | 500 |
| Comparative example | 16.4 | 3.3 | 0.3 | 500 |

As listed, the alteration process was carried out under an Ar gas partial pressure of 105.5 Pa (791.7 mTorr), a $N_2$ gas partial pressure of 21.1 Pa (158.3 mTorr), a process pressure of 126.6 Pa, and a process temperature of 500° C. in Example 1; the alteration process was carried out under an Ar gas partial pressure of 6.65 Pa (50.0 mTorr), a process pressure of 6.65 Pa, and a process temperature of 500° C. in Example 2; and the alteration process was carried out under an Ar gas partial pressure of 16.4 Pa (123.0 mTorr), a $N_2$ gas partial pressure of 3.3 Pa (24.6 mTorr), a $H_2$ partial pressure of 0.3 Pa (2.5 mTorr), a process pressure of 20 Pa (150 mTorr), and a process temperature of 500° C. in Comparative example.

(Relationship between Alteration Process Time and Film Thickness)

Figure 6:
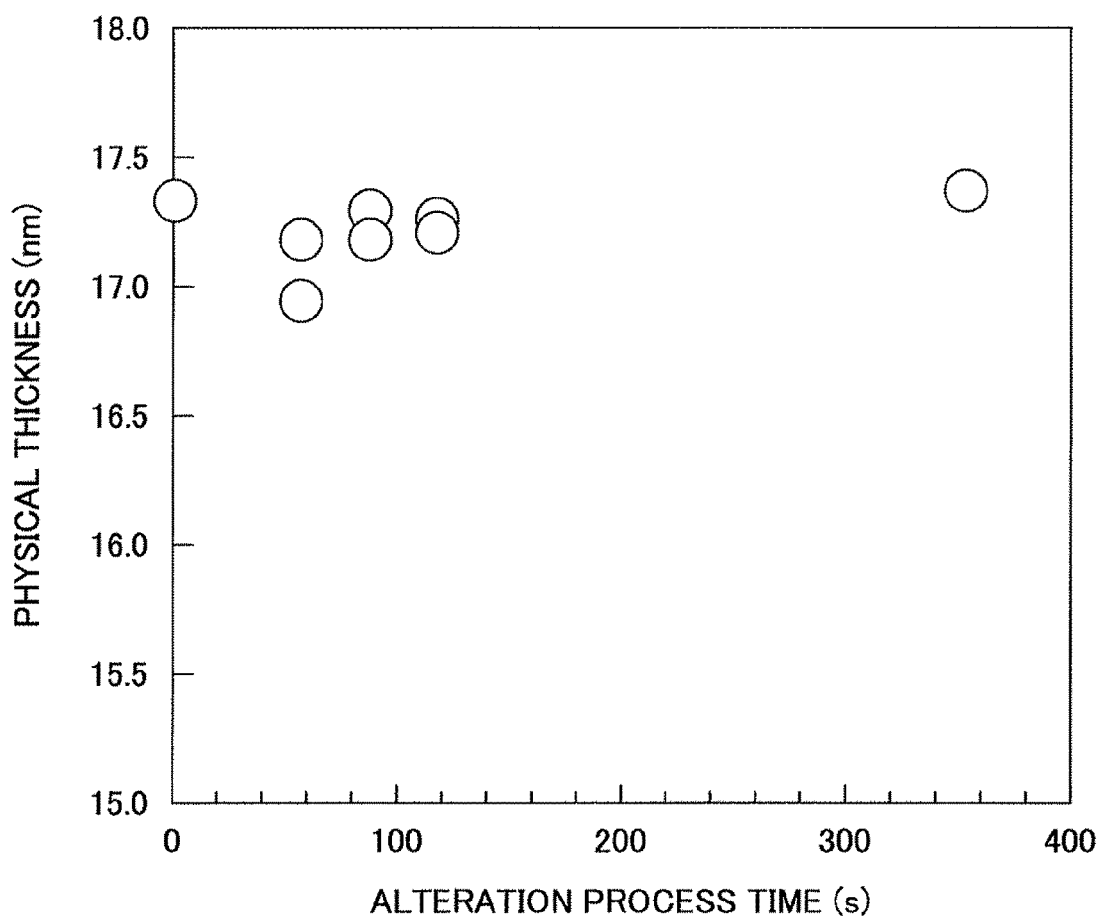
FIG. 6 is a graph illustrating a relationship between an alteration time and a physical thickness of the TiN film that goes through the alteration method according to an embodiment of the present invention.

In the alteration process of Example 1, plural samples were prepared and the TiN film alteration processes were carried out with respect to the samples with different alteration process times. Next, a film thickness of each of the TiN films of the samples was measured by an X-ray Fluorescence Spectroscopy (XRF) method. Here, the alteration process time means a period of time during which the plasma is irradiated to the TiN film in the apparatus shown in FIG. 3. The measurement results are shown in FIG. 6. In FIG. 6, the horizontal axis represents the alteration process time and the vertical axis represents a physical thickness of the TiN film. With these results, the physical thicknesses of the TIN films are substantially the same even when the alteration process time is increased. It is understood from these results that the film thickness is rarely decreased by etching of the TiN film through the plasma irradiation.

(Sheet Resistance Measurement)

Figure 5:
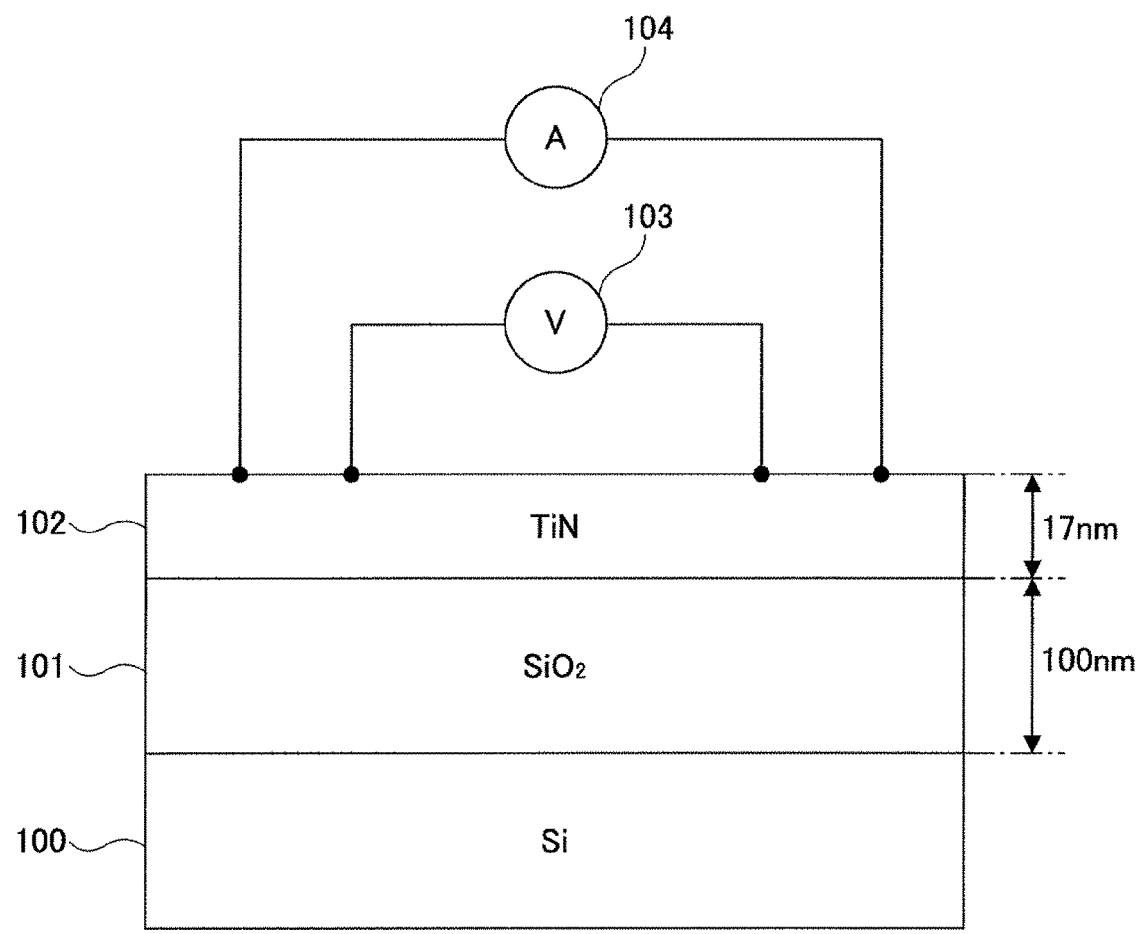
FIG. 5 is an explanatory view for explaining a method of measuring sheet resistance of the TiN film that is altered by the alteration method according to an embodiment of the present invention.
Figure 7:
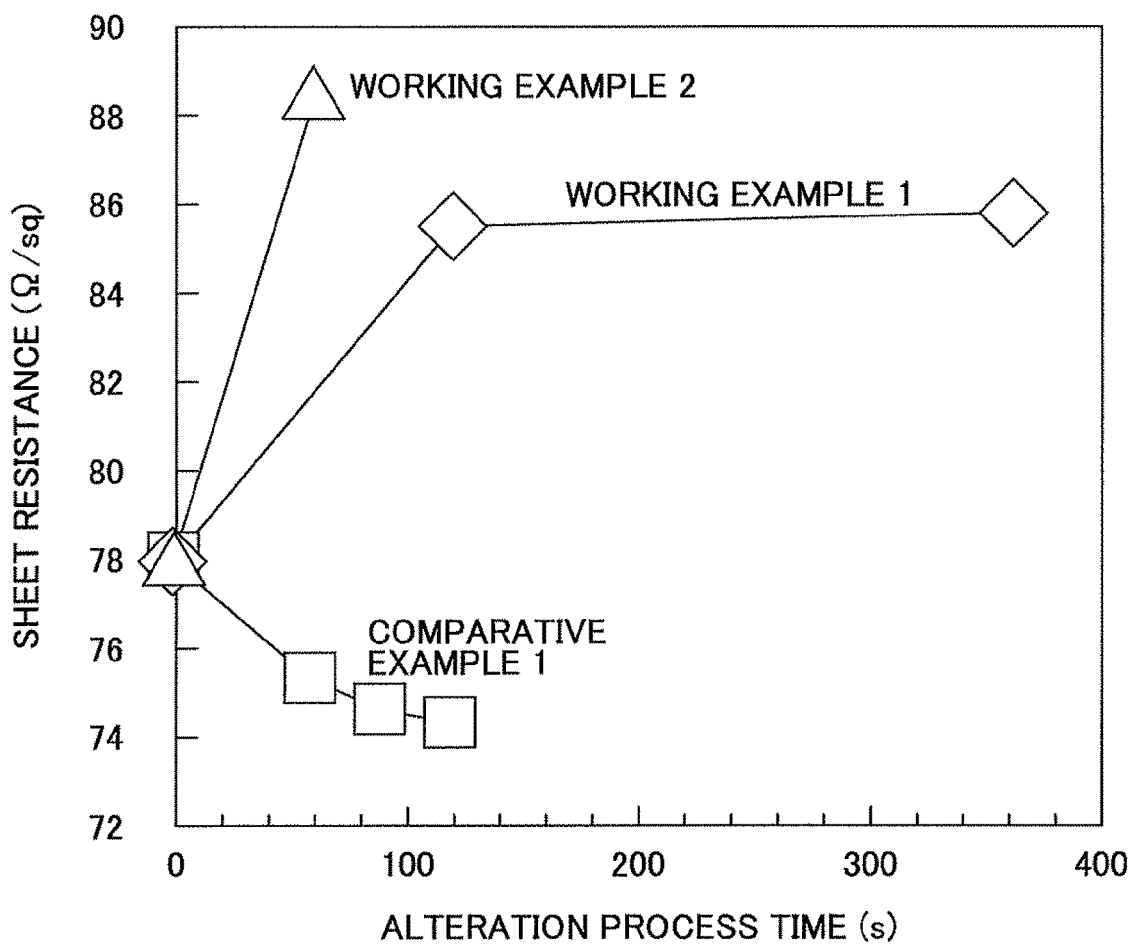
FIG. 7 is an explanatory view for explaining the sheet resistance of the TiN films that are altered by the alteration method according to an embodiment of the present invention, under alteration conditions of examples and a comparative example.

In each of Example 1, Example 2, and Comparative example, plural samples are prepared and the alteration process was carried out with respect to the samples with different alteration process times. Next, the sheet resistance of each of the samples was measured. The sheet resistance was measured by the four probe method, as shown in FIG. 5. In FIG. 5, a reference symbol "103" indicates a voltage supplying part, and a reference symbol "104" indicates a current measurement part. The measurement results are shown in FIG. 7. In FIG. 7, the horizontal axis represents an alteration process time, and the vertical axis represents sheet resistance. It has been confirmed from these results that the sheet resistance is increased with increasing time in the alteration processes of Examples 1 and 2, while the sheet resistance is decreased with increasing time in the alteration process of Comparative example. As previously stated, because the physical thickness of the TiN film is rarely changed by the alteration process, the sheet resistance is confirmed to be changed by the specific resistance.

Example 1

The sheet resistance of the TiN film that went through the alteration process of Example 1 is increased by 10.1% from 77.9 Ω/sq. to 85.5 Ω/sq., as shown in FIG. 7. In order to study a reason why the specific resistance is increased by the alteration process, X-ray diffraction (XRD) measurements with respect to the (200) plane were carried out before and after the alteration process with respect to the samples of Example 1. As a result, it has been confirmed that a full width at half maximum of the (200) plane peak is increased from 0.676 degrees (before the process) to 0.712 degrees (after the process). An increase in the full width at half maximum means deteriorated crystallinity of the TiN film and may mean that amorphous parts are increased in the film. Therefore, it is assumed that the alteration process of Example 1 causes amorphousization of the TiN film. Incidentally, the XRD measurement was carried out by a θ-2θ method.

Figure 8:
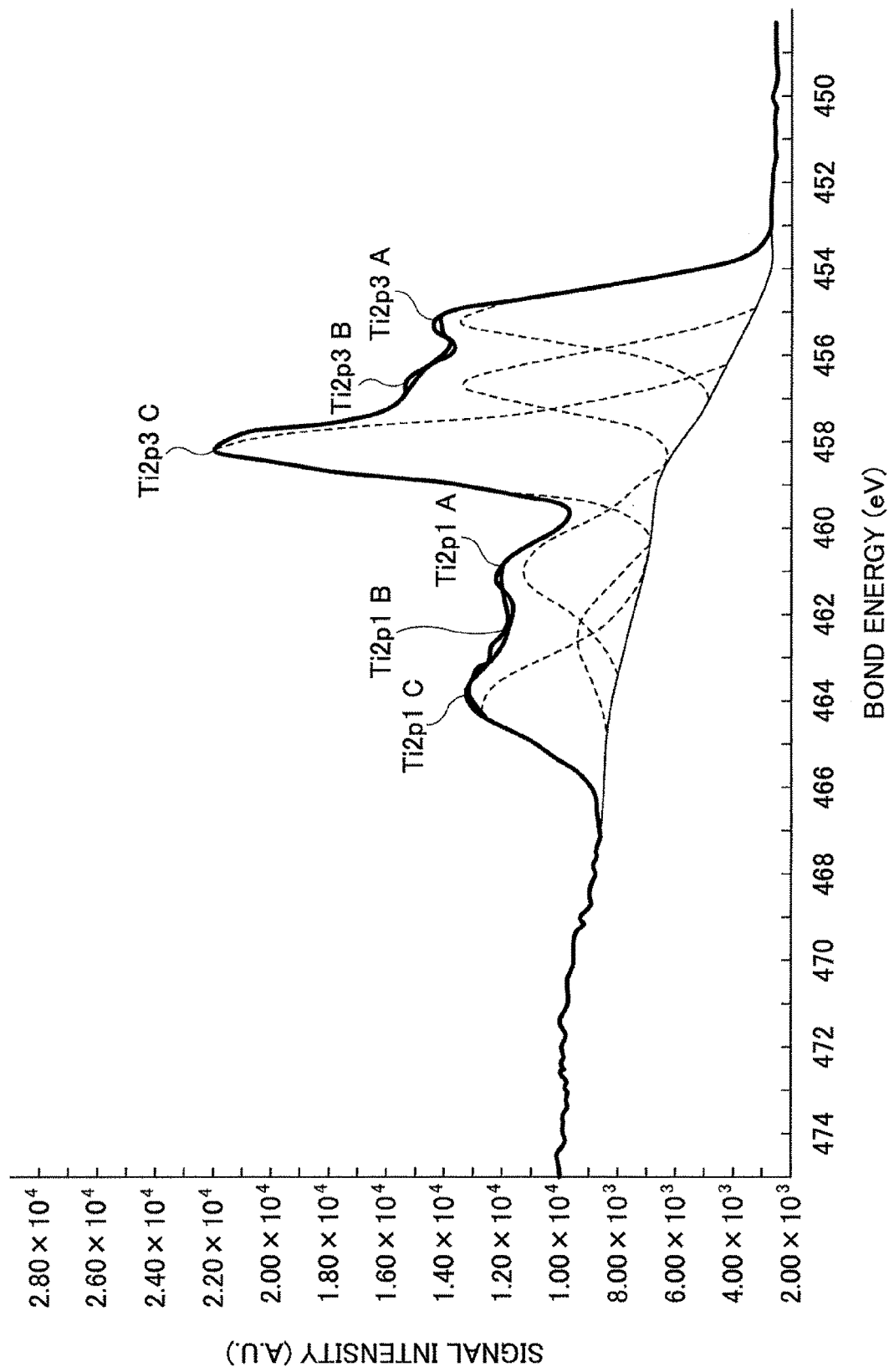
FIG. 8 illustrates XPS spectra wherein peaks originating from Ti$2p3$ bonds of the TiN film before the alteration method is carried out are shown.
Figure 9:
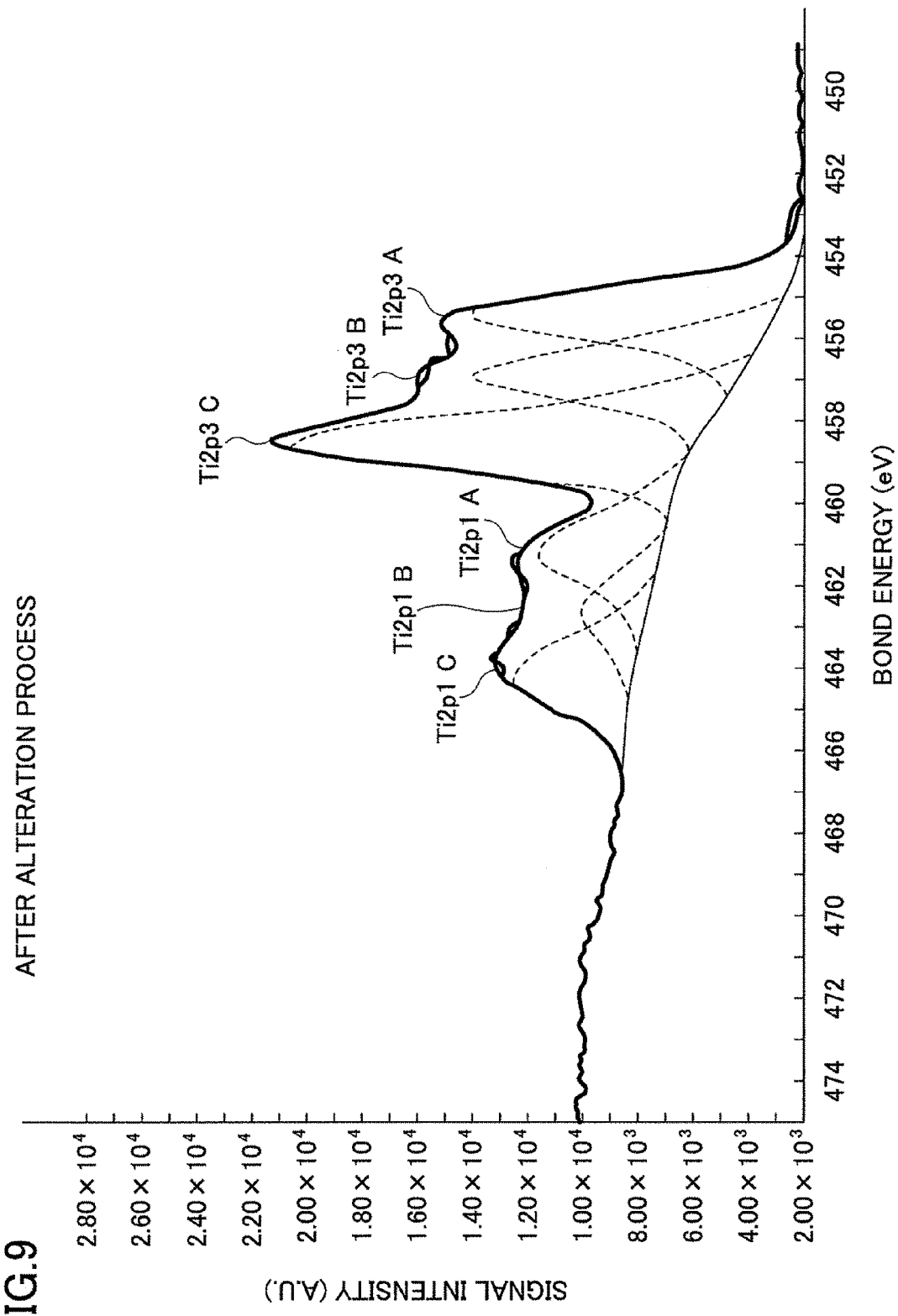
FIG. 9 illustrates XPS spectra wherein peaks originating from Ti$2p3$ bonds of the TiN film after the alteration method is carried out in Example 1 are shown.

In addition, X-ray Photoelectron Spectroscopy (XPS) measurements were carried out before and after the alteration process with respect to the TiN films. FIGS. 8 and 9 show spectra of a Ti2p3 bond and its vicinity before and after the alteration process, respectively. In FIGS. 8 and 9, the horizontal axis represents bond energy and the vertical axis represents a signal intensity. Here, the Ti2p3 bond means a bond of electrons having a spin of J=3/2(+/−3/2, +/−1/2) among sixfold degenerated valence electrons at the 2p orbit of Ti.

Figure 10:
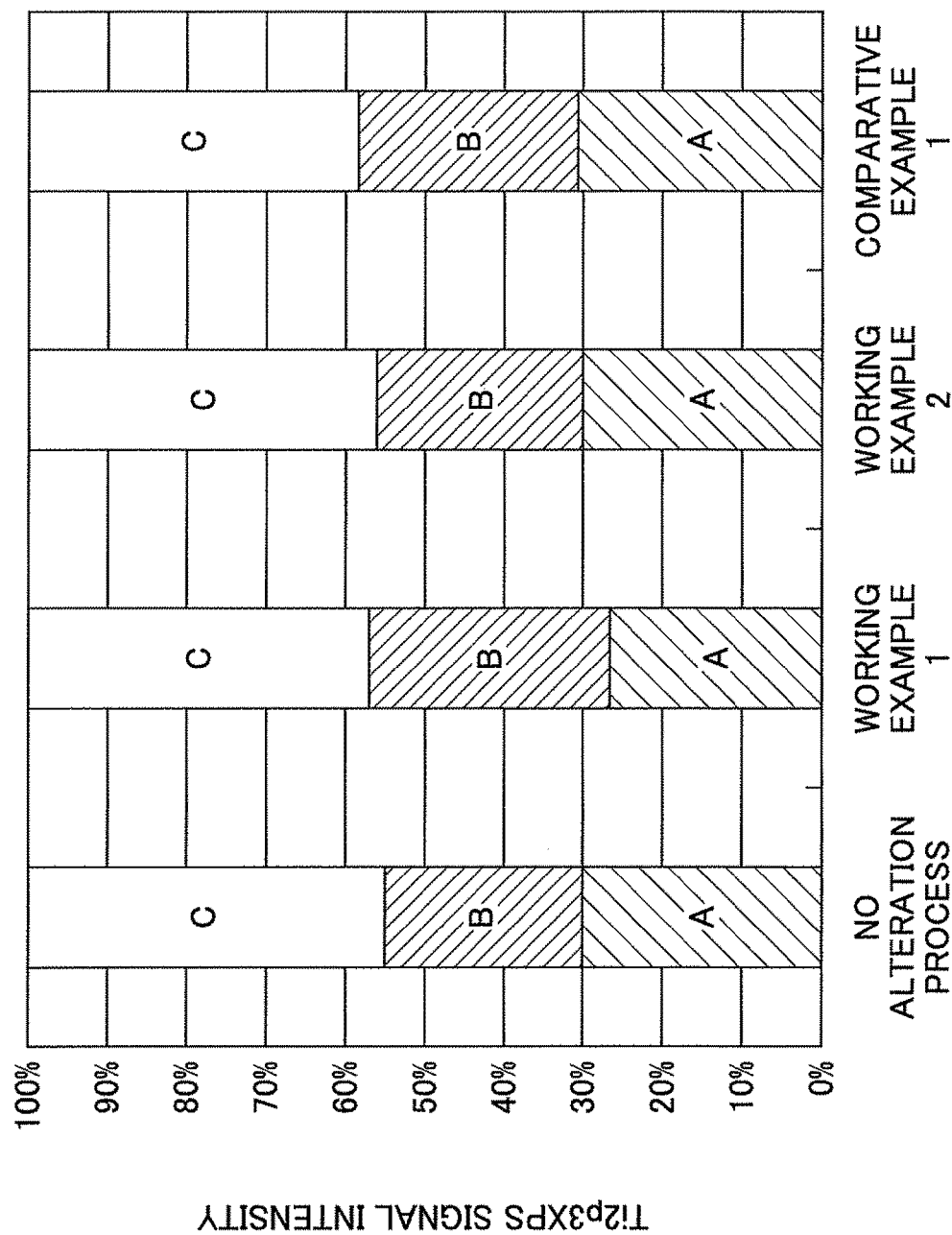
FIG. 10 is a graph illustrating an intensity ratio of signals obtained by separating the peaks originating from the Ti$2p3$ bonds in the TiN film after the alteration process of Example 1 through a comparative example.

Peaks relating to the Ti2p3 bond were separated into three signals A, B, and C in an order from low bond energy, and each of signal intensity ratios of the signal intensities was obtained. The result is shown in FIG. 10. Here, a signal A (Ti2p3 A) indicates a signal of the bond energy of 455.3 eV; a signal B (Ti2p3 B) indicates a signal of the bond energy of 456.8 eV; and a signal C (Ti2p3 C) indicates a signal of the bond energy of 458.3 eV. it is presumed that the signal A originates from a Ti—N bond; the signal C originates from a Ti—O bond.

From these results, it has been confirmed that the signal B peaks (signal intensities) are relatively increased, while the signal A peaks and the signal C peaks are relatively decreased, after the alteration process compared to before the alteration process of the Example 1. In addition, because only the Ar gas and the $N_2$ gas were used as the process gas, no oxidation reaction took place, and thus an increase in the specific resistance due to formation of an oxide film in the TiN film is not considered. Therefore, it is assumed that the increase in the specific resistance in the TiN film by the alteration process of Example 1 is caused from the increased number of the bonds represented by the B signal among the Ti2p3 bonds, as well as the amorphousization of the TiN film. In addition, when a surface flatness of the TiN film was evaluated by using an Atomic Force Microscope (AFM), an RMS roughness after the alteration process was 0.810 nm, while an RMS roughness before the alteration process was 1.075 nm, and thus an improved surface flatness caused by the alteration process is confirmed.

Example 2

Figure 11:
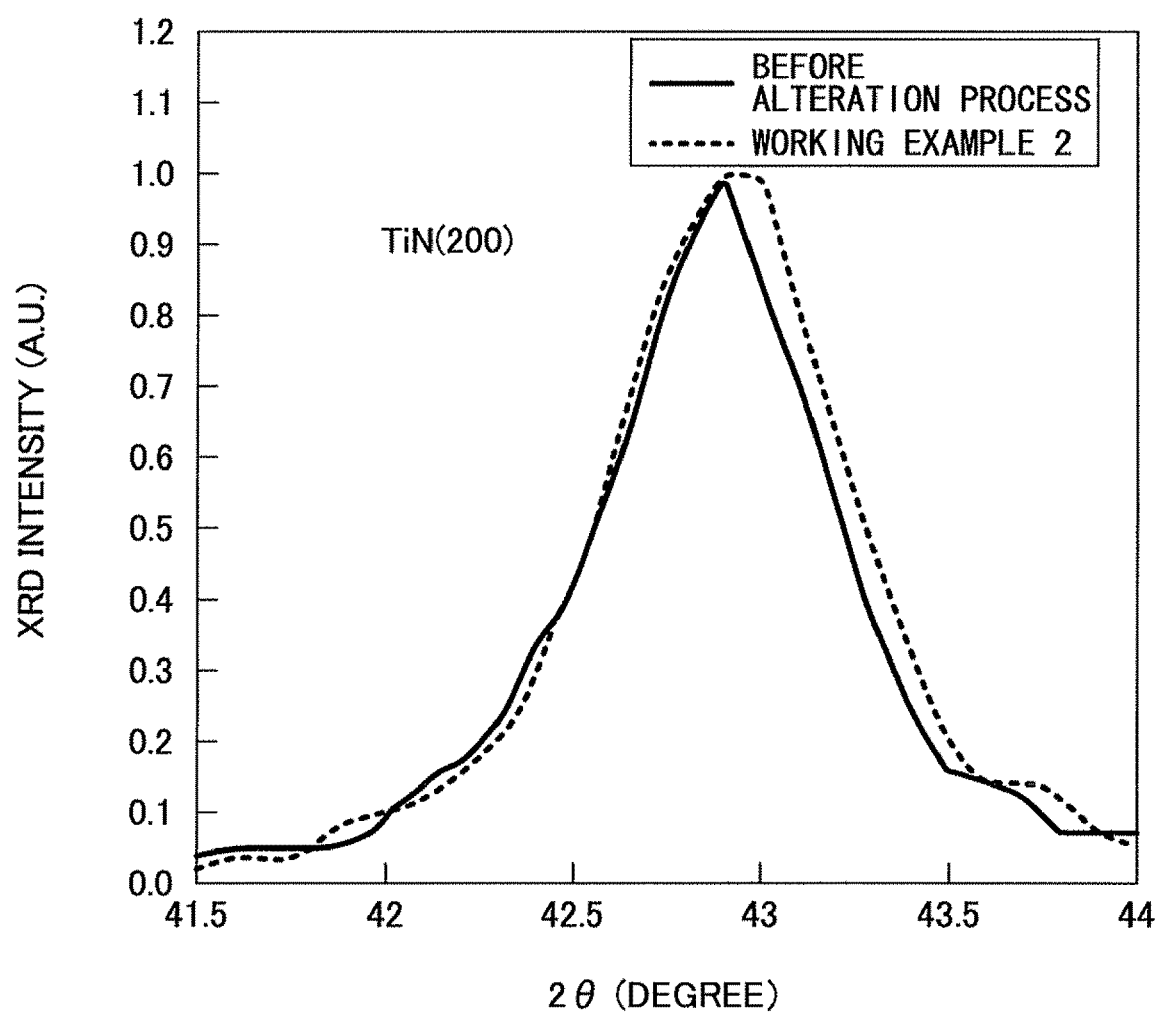
FIG. 11 is a graph illustrating XRD patterns of the TiN film after the alteration process of Example 2.
Figure 12:
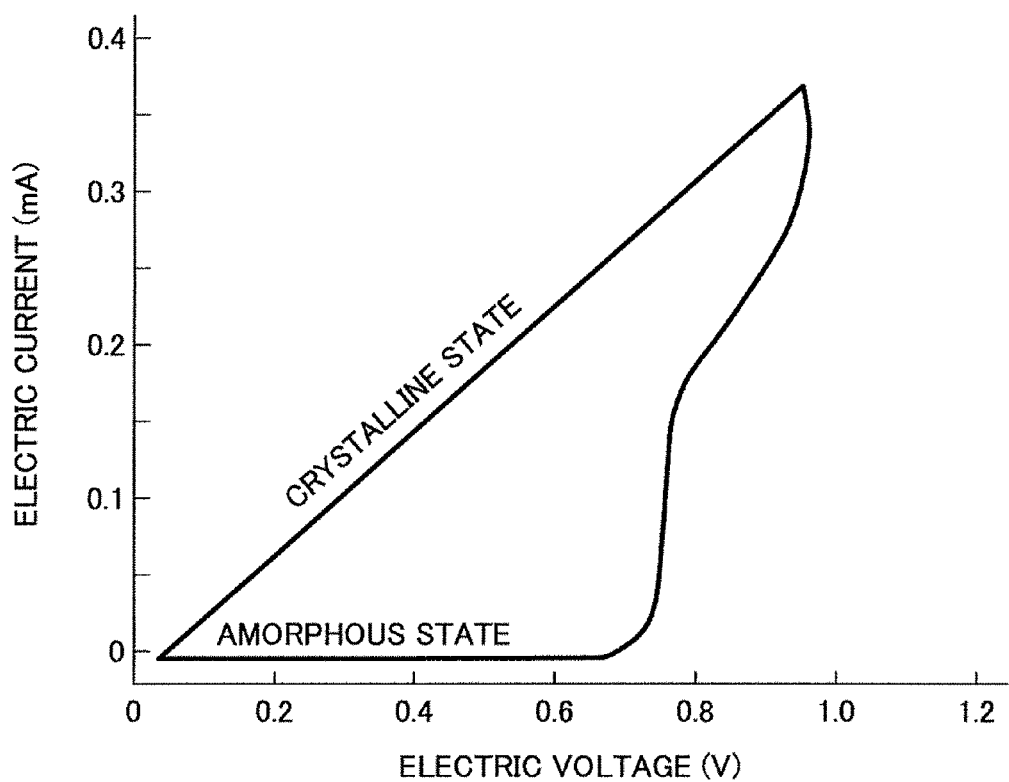
FIG. 12 is a graph illustrating resistance of the GST film.

The sheet resistance of the TiN film that went through the alteration process of Example 2 is increased by 13.1% from 77.9 Ω/sq. to 88.6 Ω/sq., as shown in FIG. 7. In order to study a reason why the specific resistance is increased by the alteration process, X-ray diffraction (XRD) measurements with respect to the (200) plane were carried out before and after the alteration process with respect to the samples of Example 2. The results are shown in FIG. 11. In FIG. 11, the horizontal axis represents a diffraction angle 2θ (degree), and the vertical axis represents a signal intensity. In addition, a solid line indicates the X-ray diffraction pattern before the alteration process and a dotted line indicates the X-ray diffraction pattern after the alteration process. The XRD measurements were carried out in the same manner as explained in Example 1. As shown in FIG. 11, a full width at half maximum of the (200) plane peak is increased by 7.24% from 0.676 degrees (before the process) to 0.725 degrees (after the process). From this result, it is assumed that amorphousization is caused in the TiN film by the alteration process of Example 2.

On the other hand, when the XPS measurements were carried out with respect to the TIN film after the alteration process, regarding the spectra in the vicinity of the Ti2p3 peak, the signal intensities of the signal A, the signal B, and the signal C are rarely changed between before and after the alteration process, as shown in FIG. 10. Therefore, it is assumed that an increase in the specific resistance due to the alteration process is originated from degradation of crystallinity of the TiN film.

In addition, when the surface flatness was evaluated by using the AFM method with respect to the TiN film before and after the alteration process, the RMS roughness after the alteration process is 0.911 nm while that before the alteration process is 1.075 nm. Namely, it is confirmed that the surface flatness is improved by carrying out the alteration process.

(Regarding Comparative Example)

A sheet resistance of the TiN film that went through the alteration process of Comparative example was decreased from 77.9 Ω/sq. to 74.2 Ω/sq. In addition, when the XRD measurement was carried out with respect to the TiN film after the alteration process, a full width at half maximum of the (200) plane peak was increased from 0.676 degrees (before the process) to 0.725 degrees (after the process), which indicates that amorphousization is caused in the TiN film. Moreover, when the XPS measurement was carried out with respect to the TiN film after the process, a signal intensity of the signal A (the Ti—N bond) was increased and a signal intensity of the signal C (the Ti—O bond) was decreased, as shown in FIG. 10. Because it is known that the specific resistance is decreased when the Ti—N bonds are increased, the resistance reduction due to an increase of the Ti—N bonds is more significant than the resistance increase due to amorphousization in this alteration process, and as a result the specific resistance of the TiN film was decreased.

(Consideration)

A difference between the process conditions of Example 1 and Comparative example resides in the process pressure, as shown in FIG. 5. It is confirmed by comparing Example 1 and Comparative example that when the process pressure is different even if the gases and their composition (Ar:$N_2$=5:1) are identical, the sheet resistance of the TiN film after the process is greatly different. Because an increase in the signal intensity of the signal B of Ti2p3 bond is not observed in Comparative example as shown in FIG. 10, as stated above, it is assumed that an increase in the signal intensity of the signal B greatly contributes to an increase in the specific resistance of the TiN film.

Therefore, because it has been confirmed from the results of the XPS measurements that the signal intensity of the signal B with respect to the total signal intensity (namely, the signal intensity of the signal B over the signal intensities of the signal A, the signal B, and the signal C) is greater than or equal to 0.29 in Example 1, it can be understood that the crystalline state may be specified by the signal intensity of the signal B. Namely, it has been confirmed that the specific resistance of the TiN film after the alteration process becomes greater by 10% or more than that before the alteration process when (the signal intensity of the signal B)/(the signal intensities of the signals A, B, and C) is greater than or equal to 0.29 in the XPS measurement.

Next, a reason why the signal intensities of the Ti2p3 signals in the TiN films are different between Example 1 and Comparative example is considered. The process pressure is higher in Example 1 than in Comparative example. It is known that Te (electric temperature) is reduced in the case of higher process pressure, and thus primary nitrogen reactive species are neutral radicals N* rather than ions $N_2^+$. Therefore, when the plasma of the Ar gas and the $N_2$ gas is irradiated to the TiN film from above in a higher pressure condition, it is assumed that the neutral N* diffuses into the inside of the TiN film, and thus $N_2$ molecules and/or nitrogen atoms are likely to individually exist in the TiN film.

This is supported by the following reason. Namely, it is thought about the bond energy of Ti2p3 that the peak of the signal A, which corresponds to the lowest energy, indicates the Ti—N bond, and the peak of the signal C, which corresponds to the highest energy, indicates the Ti—O bond, and it is assumed that the peak of the signal B indicates an intermediate bond state of these two bonds. Namely, it is assumed that the signal B peak indicates that nitrogen is incorporated as forms of $N_2$ molecules and/or the N atoms in the TiN film. Therefore, it is consistently thought that the incorporation of the $N_2$ molecules and/or the N atoms increases the signal intensity of the signal B when the TiN film is exposed to the plasma of the Ar gas and the $N_2$ gas.

On the other hand, because the process pressure is lower in Comparative example than in Example 1, Te is increased in Comparative example, and a large amount of the ions $N_2^+$ and/or $Ar^+$ are generated in addition to the neutral radicals N*. Incidentally, there has been proposed a mechanism where Si—Si bonds are broken by the $Ar^+$, and the N* and/or $N_2^+$ are incorporated therebetween, thereby producing a SiON film, when $SiO_2$ is exposed to the plasma of the Ar gas and the $N_2$ gas under a low pressure condition. According to this mechanism, it is assumed that the Ti—Ti bonds are broken by the $Ar^+$ and/or the $N_2^+$ ions and thus Ti—N bonds are formed, when the TiN film is exposed to the plasma of the Ar gas and the $N_2$ gas under a low pressure condition. By referring to the XPS signal intensity ratio of FIG. 10, formation of the Ti—N bonds is supported by the XPA measurements because the signal intensity of the signal A originating from the Ti—N bond is increased.

As explained with reference to the examples, the full width at half maximum of the 200 diffraction peak observed in the XRD measurement and the Ti2p3 bond state observed in the XPS measurement of the TiN film can be controlled by using the plasma including the noble gas, or the plasma including the noble gas and the nitrogen, and by optimizing the alteration conditions. With this, it is confirmed that the specific resistance of the TiN film can be increased by 10% or more without degradation of the surface flatness and/or a thickness of the TiN film and incorporation of impurities excluding the noble gas element and nitrogen.

Namely, because it is confirmed that the specific resistance of the TiN film is increased by 10% or more after the alteration process compared to that of the TiN film before the alteration process, when the TiN film is altered under the process conditions that satisfy the (signal intensity of the signal B)/(signal intensities of the signals A, B, and C) being more than or equal to 0.29, the alteration conditions that can increase the sheet resistance of the TIN film can be determined by the XPS peaks obtained with respect to the TiN film. Therefore, the TiN film having a desired specific resistance can be obtained by determining the alteration conditions that can form such a TIN film.

In addition, it is confirmed in the case of the alteration process using the plasma of the noble gas that the full width at half maximum of the 200 diffraction peak observed in the XRD measurement after the plasma irradiation is increased by 5% or more compared to that before the plasma irradiation in the TiN film whose specific resistance is increased by the alteration process. Namely, it is understood in the case of the alteration process using the plasma including the noble gas that the specific resistance of the TiN film is increased by 10% or more compared to that of the TiN film before the alteration process when the TiN film is altered under alteration processes that satisfy the ((the full width at half maximum of the 200 diffraction peak obtained by the XRD measurement of the TiN film before the plasma irradiation)−(the full width at half maximum of the 200 diffraction peak obtained by the XRD measurement of the TiN film after the plasma irradiation))/(the full width at half maximum of the 200 diffraction peak obtained by the XRD measurement of the TiN film after the plasma irradiation) being more than or equal to 0.05.

The alteration conditions that can increase the sheet resistance of the TiN film can be determined by the XRD peaks obtained with respect to the TiN film, and thus the TIN film having a desired specific resistance can be obtained by determining the alteration conditions that can form such a TiN film.

This international application claims priority based on a Japanese Patent Application No.2008-189079 filed Jul. 22, 2008, the entire content of which is incorporated herein by reference.

The invention claimed is:

1. An alteration method of a titanium nitride film, comprising
    exposing a titanium nitride film formed on a semiconductor substrate to plasma obtained by exciting a process gas, thereby increasing a specific resistance of the titanium nitride film,
    wherein the titanium nitride film is a heater film provided to be in contact with a phase-changing film whose resistance can be changed depending on at least one of a heating temperature and a heating time, and
    wherein the process gas consists of a normal gas or a combination of nitrogen and one noble gas.

2. The alteration method of the titanium nitride film, according to claim 1,
    wherein the exciting of the process gas is carried out by supplying microwaves to the process gas.

3. The alteration method of the titanium nitride film, according to claim 1,
    wherein the specific resistance of the titanium nitride film after being exposed to the plasma is increased by 10% or more compared to the specific resistance of the titanium nitride film before being exposed to the plasma.

4. The alteration method of the titanium nitride film, according to claim 3,
    wherein an increase rate of the specific resistance of the titanium nitride film after being exposed to the plasma with respect to the specific resistance of the titanium nitride film before being exposed to the plasma is less than 200%.

5. An alteration apparatus of a titanium nitride film, comprising:
    an air-tight process chamber that has a susceptor on which is placed a semiconductor substrate having the titanium nitride film in the process chamber, wherein the titanium nitride film is a heater film provided to be in contact with a phase-changing film whose resistance can be changed depending on at least one of a heating temperature and a heating time;

a process gas supplying part that supplies a process gas to the process chamber, wherein the process gas consists of a noble gas or a combination of nitrogen and one noble gas;

a plasma generating part that excites the process gas to plasma; and an evacuating part that evacuates the process chamber.

6. The alteration apparatus of the titanium nitride film, according to claim 5, wherein the plasma generating part generates the plasma by using microwaves.

* * * * *